United States Patent
Shah

(10) Patent No.: US 7,129,494 B2
(45) Date of Patent: Oct. 31, 2006

(54) VERY FAST DOPED LABR$_3$ SCINTILLATORS AND TIME-OF-FLIGHT PET

(75) Inventor: Kanai S. Shah, Newton, MA (US)

(73) Assignee: Radiation Monitoring Devices, Inc., Watertown, MA (US)

(*) Notice: Subject to any disclaimer, the term of this patent is extended or adjusted under 35 U.S.C. 154(b) by 42 days.

(21) Appl. No.: 10/948,913

(22) Filed: Sep. 23, 2004

(65) Prior Publication Data

US 2005/0104001 A1    May 19, 2005

Related U.S. Application Data

(60) Provisional application No. 60/505,636, filed on Sep. 24, 2003.

(51) Int. Cl.
   *G01T 1/202* (2006.01)
   *G01T 1/161* (2006.01)

(52) U.S. Cl. .................................. 250/363.03
(58) Field of Classification Search ............ 250/363.03
   See application file for complete search history.

(56) References Cited

U.S. PATENT DOCUMENTS

| | | | |
|---|---|---|---|
| 3,978,337 A | 8/1976 | Nickles et al. | |
| 4,510,394 A | 4/1985 | Allemand et al. | |
| 4,559,597 A * | 12/1985 | Mullani | 600/407 |
| 4,563,582 A | 1/1986 | Mullani | |
| 4,647,779 A | 3/1987 | Wong | |
| 4,768,156 A | 8/1988 | Whitehouse et al. | |
| 4,833,327 A | 5/1989 | Hart | |
| 4,864,140 A | 9/1989 | Rogers et al. | |
| 4,980,552 A | 12/1990 | Cho et al. | |
| 5,039,858 A | 8/1991 | Anderson et al. | |
| 5,134,293 A | 7/1992 | Anderson et al. | |
| 5,151,599 A | 9/1992 | Monnet et al. | |
| 5,159,195 A | 10/1992 | Van House | |
| 5,272,343 A | 12/1993 | Stearns | |
| 5,272,344 A * | 12/1993 | Williams | 250/363.03 |
| 5,319,203 A | 6/1994 | Anderson et al. | |
| 5,326,974 A | 7/1994 | Karras et al. | |
| 5,453,623 A | 9/1995 | Wong et al. | |
| 5,532,489 A | 7/1996 | Yamashita et al. | |
| 5,665,971 A | 9/1997 | Chen et al. | |

(Continued)

FOREIGN PATENT DOCUMENTS

WO    WO 01/60945    8/2001

OTHER PUBLICATIONS

Bollinger, L. and Thomas, G., "Measurement of the time dependence of scintillation intensity by a delayed-coincidence method," *Rev. Sci. Instrum.*, 32:1044-1050 (Sep. 1961).

(Continued)

*Primary Examiner*—Renee Luebke
*Assistant Examiner*—Mary Zettl
(74) *Attorney, Agent, or Firm*—Townsend and Townsend and Crew LLP

(57) ABSTRACT

The present invention concerns very fast scintillator materials capable of resolving the position of an annihilation event within a portion of a human body cross-section. In one embodiment, the scintillator material comprises LaBr$_3$ doped with cerium. Particular attention is drawn to LaBr$_3$ doped with a quantity of Ce that is chosen for improving the timing properties, in particular the rise time and resultant timing resolution of the scintillator, and locational capabilities of the scintillator.

26 Claims, 12 Drawing Sheets

U.S. PATENT DOCUMENTS

| | | | |
|---|---|---|---|
| 5,821,541 A | | 10/1998 | Tumer |
| 5,841,140 A | | 11/1998 | Mc Croskey et al. |
| 5,990,482 A | * | 11/1999 | Bertelsen et al. ...... 250/363.04 |
| 6,072,177 A | | 6/2000 | McCroskey et al. |
| 6,236,050 B1 | | 5/2001 | Tumer |
| 6,255,655 B1 | * | 7/2001 | Mc Croskey et al. ... 250/363.03 |
| 6,362,479 B1 | | 3/2002 | Andreaco et al. |
| 6,420,711 B1 | | 7/2002 | Tumer |
| 6,448,560 B1 | | 9/2002 | Tumer |
| 6,628,745 B1 | * | 9/2003 | Annis et al. ................... 378/21 |
| 2005/0188914 A1 | * | 9/2005 | Iltis et al. ...................... 117/2 |

OTHER PUBLICATIONS

Burnham, C. et al., "New instrumentation for position scanning," *International Conference on Radioisotopes in Localization of Tumors*, Sep. 25-27 (1967).

Detko, J.F., "Operational characteristics of a small ultra-pure germanium gamma camera," *Semiconductor Detectors in Medicine*, Mar. 8-9 (1973), U.S. Atomic Energy Commission Office of Information Services Technical Information Center.

Dorenbos, P. et al., "Non-proportionality in the scintillation response and the energy resolution obtainable with scintillation crystals," *IEEE Trans. Nucl. Sci.*, 42:2190-2202 (Dec. 1995).

Gariod, R. et al., "The 'LETI' positron tomograph architecture and time of flight improvements," Workshop on Time-of-Flight Positron Tomography May 17-19 (1982), Washington University, St. Louis, Missouri, *IEEE Catalog No. 82CH1719-3*.

Guillot-Nöel, O. et al., "Scintillation properties of $RbGd_2Br_7$:Ce advantages and limitations," *IEEE Trans. Nucl. Sci.*, 46:1274-1284 (Oct. 1999).

Kaufman, L. et al., "Delay line readouts for high purity germanium medical imaging cameras," *IEEE Trans. Nucl. Sci.*, NS-21:652-657 (Feb. 1974).

Lewellen, Tk, "Time-of-flight PET," *Semin. Nucl. Med.*, 28:268-275 (Jul. 1998).

Lewellen, Tk, et al., "Performance measurements of the SP3000/UW time-of-flight positron emission tomograph," *IEEE Trans. Nucl. Sci.*, 35:665-669 (Feb. 1988).

Moses, W. and Derenzo, S. "Scintillators for positron emission tomography," *Proceedings of SCINT '95*, Delft, The Netherlands, pp. 9-16 (1996).

Moses, W. et al., "Gamma ray spectroscopy and timing using LSO and PIN photodiodes," *IEEE Trans. Nucl. Sci.*, NS-42:597-600 (1995).

Moses, W. et al., "$LuAIO_3$:Ce—a high density, high speed scintillator for gamma detection," *IEEE Trans. Nucl. Sci.*, NS-42:275-279 (1995).

Moses, W. et al., "Performance of a PET detector module with LSO scintillator crystals and photodiode readout," *J. Nucl. Med.*, 37:85P (1996).

Moses, W. and Derenzo, S., "Prospects for time-of-flight PET using LSO scintillator," *IEEE Trans. Nucl. Sci.*, NS-46:474-478 (1999).

Mullani, N. et al., "Dynamic imaging with high resolution time-of-flight PET camera—TOFPET I," *IEEE Trans. Nucl. Sci.*, NS-31:609-613 (Feb. 1984).

Phelps, M., "Positron emission tomography provides molecular imaging of biological processes," *PNAS*, 97:9226-9233 (Aug. 1, 2000).

Shah, K. et al., "$LaBr_3$:Ce scintillators for gamma ray spectroscopy," *IEEE Trans. Nucl. Sci.* LBNL-51793, 4 pages (Dec. 2, 2002).

Surti, S. et al., "Image quality assessment of $LaBr_3$-based whole-body 3D PET scanners: a Monte Carlo evaluation," *Phys. Med. Biol.*, 49:4593-4610 (2004).

Van Loef, E. et al., "Scintillation properties of $LaBr_3$:$CE^{3+}$ crystals: fast, efficient and high-energy-resolution scintillators," *Nucl. Instr. Meth. Physics Res. A*, 486:254-258 (2002).

Van Loef, E. et al., "High-energy-resolution scintillator:$Ce^{3+}$ activated $LaBr_3$," *Appl. Phys. Lett.*, 79:1573-1575 (Sep. 3, 2001).

Weber, M. et al., "Dense $Ce^{3\circ}$-activated scintillator materials," *Proceedings of SCINT '95*, Delft, The Netherlands, pp. 325-328 (1996).

Wong, W. et al., "Characteristics of small barium fluoride (BaF) scintillator for high intrinsic resolution time-of-flight positron emission tomography," *IEEE Trans. Nucl. Sci.*, NS-31:381-386 (Feb. 1984).

Yamamoto, M. et al., "Time-of-flight positron imaging and the resolution improvement by an interactive method," *IEEE Trans. Nucl. Sci.*, 36-998-1002 (Feb. 1989).

\* cited by examiner

VERY FAST DOPED LABR₃ SCINTILLATORS AND TIME-OF-FLIGHT PET

CROSS-REFERENCES TO RELATED APPLICATIONS

This application claims the benefit of U.S. Provisional Patent Application No. 60/505,636, entitled "Very Fast Doped LaBr3 Scintillators and Time-of-Flight PET," filed Sep. 24, 2003, the complete disclosure of which is incorporated herein by reference in its entirety.

STATEMENT AS TO RIGHTS TO INVENTIONS MADE UNDER FEDERALLY SPONSORED RESEARCH OR DEVELOPMENT

Aspects of this research was conducted with funding provided by the Department of Energy and the National Institute of Health. Contract No. DE-AC03-76SF00098 and Grant Nos. R01-CA67911 and P01-HL25840, respectively. The United States Government may have certain rights in the application.

BACKGROUND OF THE INVENTION

The present invention relates generally to scintillators. More specifically, the present invention provides lanthanum bromide ($LaBr_3$) scintillators for use with medical imaging scanner systems, such as time-of-flight PET scanner systems.

One form of medical imaging is called positron emission tomography and is better known by its acronym PET. In PET (or PET scan), the patient is injected with or otherwise administered a molecule labeled with a positron-emitting radioactive element. In some applications the radiotracer is distributed through the body, and concentrated in (or excluded from) target tissues of interest. The radioactive material decays by emission of a positron, or antiparticle of the negatively-charged electron. The positron is slowed down within a short distance from the emission point and forms a short-lived "atom" consisting of the positron and an electron from a nearby atom. The "atom," referred to as positronium, decays by the annihilation of its constituents. This annihilation produces two essentially back to back 511 keV gamma rays which are emitted in substantially opposite directions. When both of the gamma rays are detected by detectors surrounding the body, it can be assumed with high probability that the emission point was somewhere along a line joining the two detectors. Without additional information, the probability that the radiotracer was located on any one point in the body that the detection line intersects is equal for all points in the line, and hence, for all points in the body being scanned.

A variety of algorithms have been developed that make it possible to form an image from a collection of such lines. The quality of the image improves, in general, as the number of lines increases. Similarly, as the signal-to-noise of the image depends on the square root of the number of lines, each line representing one annihilation event, more lines offer an improved signal to noise ratio. Nevertheless, a common aspect of all image formation or reconstruction algorithms is that the noise increases in the process of deciding where along the detected line the annihilation event is likely to have occurred. In one aspect, this effect can be thought of in terms of energy and work: The detected lines represent the energy in the image and a large part of that energy is used up as work in localizing the annihilation along the particular line, instead of contributing to image quality. If the body cross-section is 30 cm and the desired localization accuracy of an annihilation event is 5 mm, localization requires reducing the uncertainty of its location by a factor of 60.

The annihilation gamma-rays travel at a speed of about 30 cm/nanosecond (1 foot/ns). The timing accuracy of detectors currently used commercially in PET cameras is a few nanoseconds (ns). Timing resolution is typically applied to two aspects of PET: One use is to reduce accidentals (the overlapped detection of two unrelated gamma-rays). The other use is in timing signals for localization purposes. While any improvement in time resolution aids in accidentals reduction, until the time resolution drops substantially below about 1 ns, greater time resolution will not help in localization of an annihilation event within a target of about 30 cm—the more common presentation in human-PET scanning. That is, if a body cross-section is about 30 cm, that very fact localizes the event without any recourse to time resolution. With that limitation, an improvement in localization from 4 nanosecondss (4 feet) to 1 nanosecond (1 foot) offers no improvement to image quality. On the other hand, a time signal improvement from 1 nanosecond to 500 picoseconds (0.5 nanoseconds) reduces the uncertainty of event location by a factor of 2. To appreciate the value of this particular improvement, it is to be noted that the factor of 2 increase in time resolution accuracy results in a corresponding increase in signal-to-noise ratio. This results in the equivalent of a factor of 4 increase in detected annihilation events. Placed in a different context, under the same circumstances, an image (actually a data set) that may take 15 minutes to obtain with a 1 nanoseconds time resolution, is obtained in under about 4 minutes when the time resolution is 500 picoseconds.

FIG. 1 illustrates the principle on which the location along the detected line is used to improve image formation.

It is generally recognized that a fast timing scintillator in PET cameras will enable time-of-flight PET when the timing accuracy is below 1 nanosecond. Hitherto no true time-of-flight PET device has been enabled. Barium fluoride ($BaF_2$), lutetium orthosilicate (LSO) and bismuth germanate (BGO) have been suggested as potentially useful scintillation materials, but none of these materials has the 500 picosecond (ps) or less time resolution needed to achieve a successful device. $BaF_2$ actually provides a ~250 ps (FWHM) timing resolution, but it has a low emission intensity for the fast component and emits in blue region of the spectrum where special photomultiplier tubes (PMTs) with quartz windows are required for readout. It is noted that a number of plastic scintillators have a time resolution below 500 picoseconds, but due to inadequate stopping power, (attenuation length at 500 keV is typically greater than 10 cm), these scintillators are not suitable for medical uses.

The present invention provides very fast scintillator materials capable of resolving the positron of an annihilation event within a portion of a human body cross-section (less than 400 picoseconds), specifically, the very fast scintillator material comprises $LaBr_3$ doped with various concentrations of cerium. Particular attention is drawn to the unexpected discovery that the quantity of Ce used to dope $LaBr_3$ improves the timing properties (rise time and timing resolution), stopping power and locational capabilities of the scintillator to provide a scintillator capable of use for actual time-of-flight PET.

Attention is drawn to several references in the field, the teachings of which are incorporated herein by reference (as are all references cited herein):

U.S. Pat. No. 6,362,479, "Scintillation detector array for encoding the energy, position, and time coordinates of gamma ray interactions," discloses a scintillator-encoding scheme that depends on the differential decay time of various scintillators. The use of LSO-LSO crystals with a time resolution of 1.6 nanoseconds is also discussed. A time resolution of 1.6 nanoseconds is equivalent to an approximately 50 cm uncertainty, which is as large as the cross-sectional dimension of the human body, and not useful in the present context.

U.S. Pat. No. 5,453,623, "Positron emission tomography camera with quadrant-sharing photomultipliers and cross-coupled scintillating crystals." Discloses arrangement of hardware elements in PET camera and use of scintillators. Only specific scintillator disclosed is BGO.

Moses et al., "Prospects for Time-of-Flight PET using LSO Scintillator," *IEEE Trans. Nucl. Sci.* 46:474–478 (1999).

U.S. Pat. No. 5,319,203 and U.S. Pat. No. 5,134,293, both entitled "Scintillator material." Discloses Cerium fluoride and thallium doped Cerium fluoride as "improved" scintillator material.

U.S. Pat. No. 5,039,858, "Divalent fluoride doped cerium fluoride scintillator." Discloses additional doped cerium fluoride scintillators.

U.S. Pat. No. 4,510,394, "Material for scintillators." Discloses barium fluoride as scintillator material.

van Loef et al., "High energy resolution scintillator: $Ce^{3+}$ activated $LaBr_3$", *Appl. Phys. Lett.* 79:1573–1575 (2001).

van Loef et al., "Scintillation properties of $LaBr_3:Ce^{3+}$ crystals: fast, efficient and high-energy-resolution scintillators", *Nucl. Instr. Meth. Physics Res. A* 486:254–258 (2002). Discloses certain characteristics of cerium doped $LaBr_3$ compositrons including, light yield, and scintillation decay curve. The rise time and time resolution of the compositrons are not disclosed or suggested.

WO 01/60945, "Scintillator crystals, method for making same, use thereof", Discloses inorganic scintillator material of the general compositron $M_{1-x}Ce_xBr_3$, where M is selected from lanthanides or lanthanide mixtures of the group consisting of La, Gd, and Y. X is the molar rate of substitution of M with cerium, x being present in an amount of not less than 0.01 mol % and strictly less than 100 mol %. The rise time and time resolution of the various compositrons are not disclosed or suggested.

BRIEF SUMMARY OF THE INVENTION

In one embodiment the present invention comprises a very fast scintillator comprising lanthanum bromide ($LaBr_3$) and a trivalent cerium dopant. In one configuration, said cerium dopant is present at about 0.2% or more and less than 100% by molar weight, particularly from about 10% or more and less than 100% by molar weight, and more particularly from about 10% to about 30% by molar weight. One particularly useful embodiment has the cerium dopant at about 20% by molar weight.

In some embodiments, the $LaBr_3$ scintillators encompassed by the present invention typically have a time resolution less than about 1 nanosecond, preferably below about 500 picoseconds (i.e., 0.5 nanoseconds), and more preferably below about 400 picoseconds (i.e., 0.4 nanoseconds). The scintillators of the present invention typically have a rise time of less than about 3.4 nanoseconds, and preferably below about 0.7 nanoseconds, and more preferably below about 0.14 nanoseconds, and most preferably between about 0.14 nanoseconds and about 0.1 nanoseconds, thus making the scintillator compositrons useful for time-of-flight PET.

In certain embodiments of the present invention, the scintillators have a fast component with a decay constant of about 15 to about 18 nanoseconds and a slow component, when present, with a decay constant of about 55 to about 70 nanoseconds.

In another aspect the invention comprises a positron emission camera scanner system comprising a patient area and an assembly of radiation detectors disposed adjacent the patient area. The radiation detector comprises a fast scintillator comprising lanthanum bromide and a trivalent cerium dopant. A scintillation light detector or photomultiplier tube is optically coupled to the scintillator. A control system is coupled to the light detectors or photomultiplier tube.

The positron emission camera scanner systems of the present invention may be used in coincidence detection positron emission tomography by recording the differential arrival time of two photons so as to localize an annihilation event. The systems typically are able to localize an annihilation even to within a distance of less than about 15 cm.

The cerium dopant is typically present in the scintillator at about 0.5% or more and less than about 100% by molar weight, particularly present at about 10% or more and less than about 100%, more particularly between about 10% or more and less than or equal to about 30% by molar weight. In one particularly useful embodiment, the dopant is present at about 20% by molar weight. The compositrons comprising cerium dopant also have sufficient stopping power, rise time, and energy and/or timing resolution required for a positron emission camera system useful for time-of-flight measurements, as described above.

In some embodiments the PET scanner system comprises two or more scintillators, in which each scintillator comprises an individual scintillation light detector or photomultiplier tube. Alternatively, each scintillator may comprise a positron sensitive detector or array. Additionally, the scanner system may comprise an assembly for correcting for different timing offsets of individual detectors. Furthermore, the scanner provides for the timing offsets of individual detectors to be stored in a computer memory of the scanner.

In one particular embodiment, for each detector the offsets are subtracted from each gamma-ray time arrival value prior to computation of a localization. Also noted is the scanner wherein the timing signals of individual detectors are equalized by the introduction of individual hardwired delays in the signal readout electronics. Optionally, the scanner, may comprise two or more scintillators, one which uses Ce doped $LaBr_3$ in combination with other another type of scintillator.

In another aspect, the present invention provides a method of localizing a positron annihilation even within a portion of a human body cross-section which comprises using a positron emission tomography scanner system that has a scintillator comprising lanthanum bromide ($LaBr_3$) and a trivalent cerium as a dopant.

The scintillator typically has a fast component with a decay constant of about 15 to about 18 nanoseconds, a slow component, if present, with a decay constant of about 55 to about 70 nanoseconds. The cerium dopant can be present at about 0.5% or more and less than about 100% by molar weight, particularly about 10% or more and less than about 100%, and more particularly the cerium dopant is present at about 10% or more and less than about 30% by molar weight. In one particularly useful embodiment the cerium dopant is present at about 20% by molar weight.

The $LaBr_3$ scintillators used in the methods typically have a time resolution less than about 1 nanosecond, preferably below about 500 picoseconds (i.e., 0.5 nanoseconds), and more preferably below about 400 picoseconds (i.e., 0.4 nanoseconds). The scintillators of the present invention typically have a rise time of less than about 3.4 nanoseconds, and preferably below about 0.7 nanoseconds, and more preferably below about 0.14 nanoseconds, and most preferably between about 0.14 nanoseconds and about 0.1 nanoseconds)

In another aspect of the present invention is a method of performing time-of-flight positron emission tomography. The method comprises administering a patient with a radiopharmaceutical label and positroning the patient in a patient area. A plurality of scintillators and detectors are positroned around the patient area. At least some (and preferably all) of the detectors comprise lanthanum bromide and trivalent cerium as a dopant. The scintillators and detectors are used to detect gamma ray emissions from the patient and a time-of-flight localization of the gamma ray emissions is performed.

The scintillator typically has a fast component with a decay constant of about 15 to about 18 nanoseconds, a slow component, if present, with a decay constant of about 55 to about 70 nanoseconds. The cerium dopant can be present at about 0.5% or more and less than about 100% by molar weight, particularly about 10% or more and less than about 100%, and more particularly, the cerium dopant is present at about 10% or more and less than about 30% by molar weight. In one particularly useful embodiment the cerium dopant is present at about 20% by molar weight.

The $LaBr_3$ scintillators used in the methods typically have a time resolution less than about 500 picoseconds (i.e., 0.5 nanoseconds), and more preferably below about 400 picoseconds (i.e., 0.4 nanoseconds). The scintillators of the present invention typically have a rise time of less than about 3.4 nanoseconds, and preferably below about 0.7 nanoseconds, and more preferably below about 0.14 nanoseconds, and most preferably between about 0.14 nanoseconds and about 0.1 nanoseconds)

The imaging method comprises injecting or otherwise administering a detectable label to a patient, and after a sufficient period of time to allow localization or distribution of the label, placing the patient within the field of view of the device. When a 511 keV gamma ray is detected by any one detector, the scanner system opens a time window (no less than about 1 nanosecond long for the whole body, but longer if the time resolution of the device is worse than 1 nanosecond, e.g., 10 nanosecond for one of the conventional scanners described above). If another 511 keV event is detected within this time window at a second detector that is across the body from the first detector (or, in some embodiments, where each detector comprises positron sensing built within it), the positron within the detector and the detector's positron are recorded, as well as the arrival times. Each positive pair defines a line. From the known body size, the length of the line need not be the distance between detectors, it can be just the size of the cross the body from the first detector, this event is accepted as a coincidence.

If there is no Time-of-Flight (TOF) information, equal probability is assigned to each point on the line. The reconstruction of the image then proceeds by one of the dozens of algorithms known in the art. If TOF information is available, then the probability of origin of the event along the line can be represented as a Gaussian or similar distribution of width equal to the TOF FWHM, centered on the most probable point. Similar reconstruction algorithms, modified to take advantage of the TOF information can be used for reconstruction, and these modifications are also well known in the art.

In a further embodiment the present invention comprises an X-ray computed tomography (CT) scanner system comprising a fast scintillator comprising lanthanum bromide and a trivalent cerium dopant. The dopant is typically present at about 10% or more and less than about 100% by molar weight, preferably between about 10% or more and less than or equal to about 30% by molar weight, and more preferably about 20% by molar weight. The cerium doped lanthanum bromide fast scintillator also possess additional characteristics necessary for an x-ray CT scanner system, such as for example, high detection efficiency (high density and atomic number), high light output, linear light output with energy, fast decay time, low cost and ease of crystal fabrication.

Similar to above, the $LaBr_3$ scintillators encompassed by the present invention typically have a time resolution less than about 1 nanosecond, preferably below about 500 picoseconds (i.e., 0.5 nanoseconds), and more preferably below about 400 picoseconds (i.e., 0.4 nanoseconds). The scintillators of the present invention typically have a rise time of less than about 3.4 nanoseconds, and preferably below about 0.7 nanoseconds, and more preferably below about 0.14 nanoseconds, and most preferably between about 0.14 nanoseconds and about 0.1 nanoseconds.

For a fuller understanding of the nature and advantages of the present invention, reference should be had to the ensuing detailed description taken in conjunction with the accompanying drawings. The drawings represent embodiments of the present invention simply by way of illustration. The invention is capable of modification in various respects without departing from the invention. Accordingly, the drawings and description of these embodiments are illustrative in nature, and not restrictive.

BRIEF DESCRIPTION OF THE DRAWINGS

FIG. 5B is the inset in FIG. 5 and shows the central portion of the plot magnified.

DETAILED DESCRIPTION OF THE INVENTION

Figure 1:
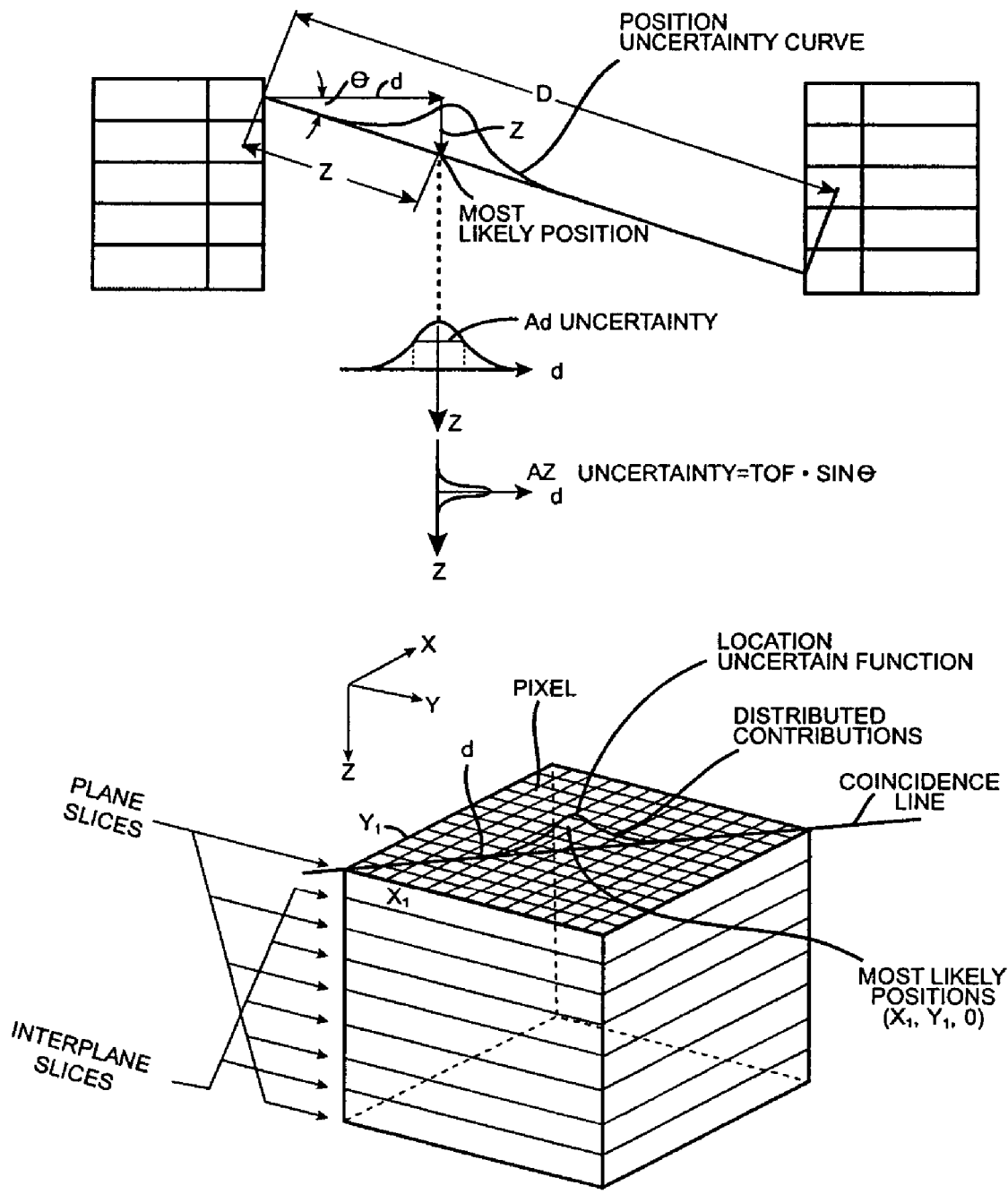
FIG. 1 illustrates the principle on which the location along the detected line is used to improve image formation.

This invention will be better understood with resort to the following non-limiting definitions:

A. Rise time, in reference to a scintillation crystal material, shall mean the speed with which its light output grows once a gamma ray has been stopped in the crystal. The contribution of this characteristic of a scintillator combined with the decay time to result in a timing resolution of less than 500 picosecond (ps) is of particular interest for use in methods comprising time-of-flight detection of an annihilation event as originating within about a 30 cm distance.

B. Fast timing scintillator should be capable of localizing an annihilation event as originating from within about a 30 cm distance, i.e., from within a human being scanned. This typically requires a timing resolution of about 500 ps or less.

C. Timing accuracy, usually defined by the full width half maximum (FWHM) of the time of arrival differences from a point source of annihilation gamma-rays. Because of a number of factors, there is a spread of measured values of times of arrival, even when they are all equal. Usually they distribute along a bell-shaped or Gaussian curve. The FWHM is the width of the curve at a height that is half of the value of the curve at its peak.

D. Light Output shall mean the number of light photons produced per unit energy deposited by the detected gamma-ray, typically the number of light photons/keV.

E. Stopping power or attenuation shall mean the range of the incoming x-ray or gamma-ray in the scintillation crystal material. The attenuation length, in this case, is the length of crystal material needed to reduce the incoming beam flux to $1/e^-$.

F. Proportionality of response (or linearity). For some applications (such CT scanning) it is desirable that the light output be substantially proportional to the deposited energy.

G. Coincidence timing window/coincidence detection shall mean the length of time allowed for deciding whether two detected 511 keV gamma-rays belong to the same positron annihilation event. This window is desired to be as short as possible, but no shorter than the time it takes the gamma-rays to travel through the body (>1 nsec).

H. Single line time-of-flight (TOF) localization shall mean the process by which, through timing of the signals, the positron of the annihilation event is localized to a portion of the line joining the detectors, this portion being smaller than the length of the line that is within the body.

I. Position sensitive detector or array shall mean a detector where the positron of the gamma-ray interaction within the detector is determined. In some embodiments this is done through the Anger principle of light division (well known in the state of the art). For instance, there can be a photodetector at each end of the crystal and the proportion of light reaching each detector determines positron, or an array of photodetectors where the center of mass of the light distribution determines positron (i.e., the closest detectors get more light).

J. Method to correct for different timing offsets of an individual detector shall be understood to include, among others, software code that stores each detector's individual timing delay and code to subtract from each timing signal this pre-stored value. Method to introduce through delay lines (cables through which the signal travels) a fixed delay for each detector, so that their signals all have the same arrival delay at the timing electronics.

Figure 2:
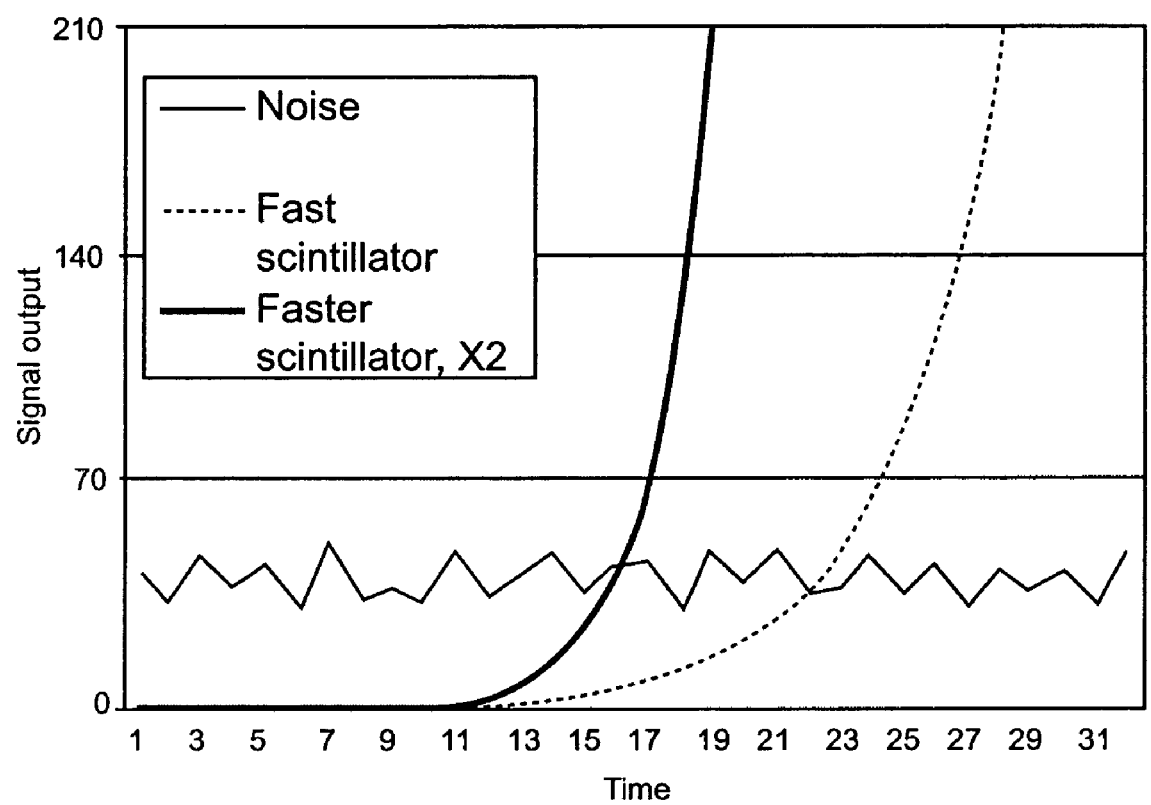
FIG. 2 represents output signals of two scintillators with the same light output, but one with a rise time speed twice as fast as the other.

A property of a scintillator crystal material is the speed with which its light output grows once a gamma ray has been stopped in the crystal. This property is characterized by the rise time of the scintillator crystal. An example is shown in FIG. 2 for two scintillators with the same light output, but one with a rise time speed twice as fast as the other. There is a noise level (due to readout electronics) that does not allow the signal to be reliably detected until it exceeds a certain threshold (about 70 in the illustrated example). Both signals start at point 10 on the horizontal axis of the graph, and the faster scintillator crosses the threshold above noise faster. Consequently, variations in timing from different pulse strengths will be smaller for the faster rise time speed scintillator. The faster rise time scintillator permits a higher time resolution.

Figure 3:
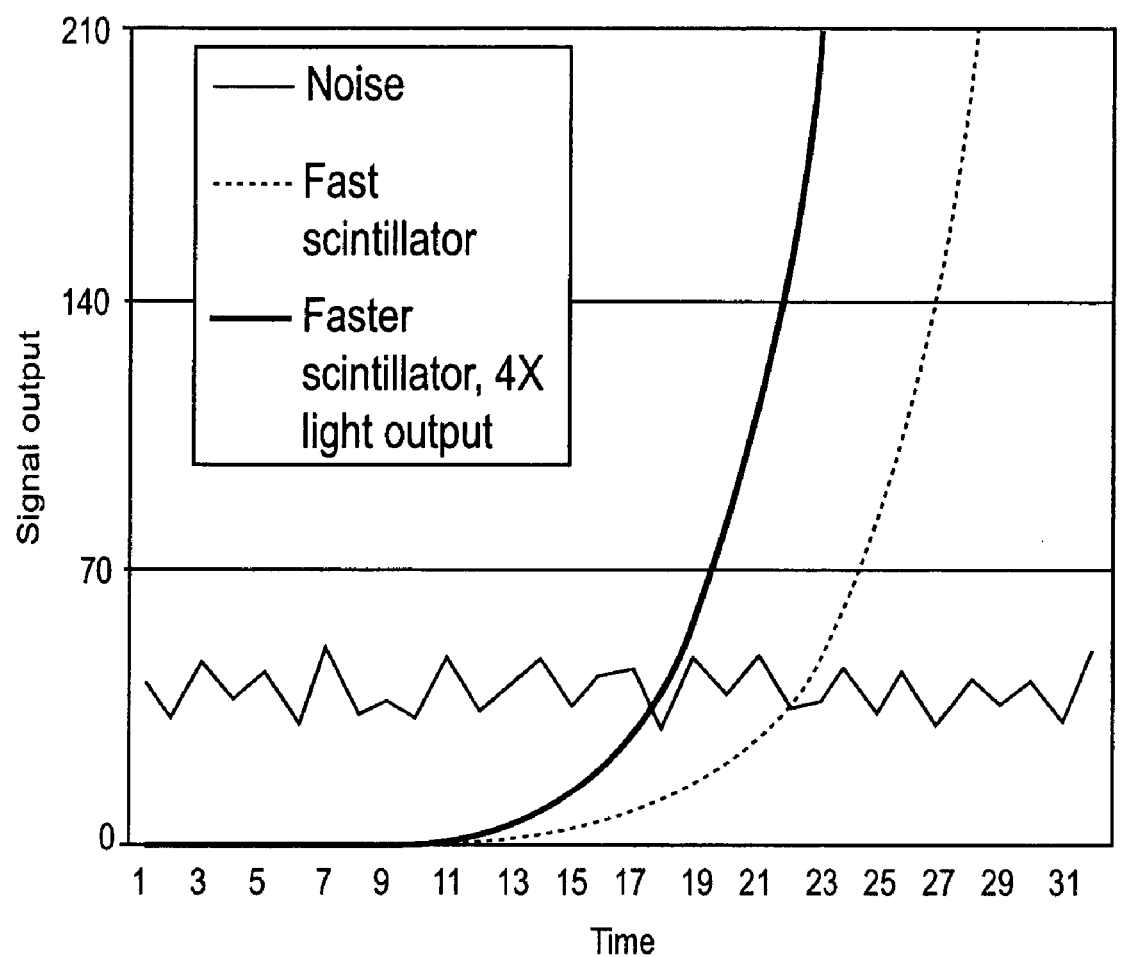
FIG. 3 shows the signal output from two scintillators of equal speed but different light output.

Increased or high light output impacts the signal-to-noise ratio in scintillation detection. Given the noise generally inherent in the readout electronics, higher light output leads to better energy resolution. Better energy resolution is useful in identifying and excluding gamma-ray detections of gamma-rays that have scattered in the body yielding a "false" line as compared with those that have not scattered. Higher light output also enables improved accuracy in timing. As the signal rises towards a higher peak value, it crosses a noise-dictated threshold of detectability sooner. As a result variations in signal output (due to finite energy resolution) lead to a smaller range of time differences in crossing the threshold. FIG. 3 shows the signal output from two scintillators of equal speed (rise time) but different light output.

Stopping power is an aspect of detector efficiency. Stopping power, particularly at 511 keV, is an important parameter for a scintillator material for use in a PET scanner or camera. This efficiency is dependent, in part, on the density and average atomic number of the scintillator material. High values of both density and average atomic number tend to increase detection or stopping power of the scintillator. A high stopping power is advantageous, and the higher, the better. The high attenuation power of $LaBr_3$ (short attenuation length), means that physically smaller detectors can be built while maintaining good detection efficiency. Smaller detectors are understood by those familiar with the art as providing better time and spatial resolution.

In the practice of the present invention, attention is paid to the physical properties of the scintillator material. In most embodiments a robust scintillator crystal or ceramic is preferred. Similarly, in particular applications, properties such as hygroscopy (tendency to absorb water), brittleness (tendency to crack), and crumbliness should be minimal.

Table I below presents properties of two conventional positron cameras currently in the market. The time resolution of one of them, the TOFPET TTV 03, at 650 ps does not significantly localize an annihilation event within the typical 30 cm cross-section of a human. For such a time resolution, up to 40% of detected events can be localized to within 10 cm, and approximately 15% will appear to arise from outside a 30 cm body cross-section. A time resolution of 650 ps is not usually acceptable for use in TOF localization. A time resolution of less than at least 500 ps is typically desired.

TABLE I

|  | TOFPET TTV 03 | PET Siemens/CTI |
| --- | --- | --- |
| Ring diameter [mm] | 890 | 820 |
| Number of rings | 4–6 | 24 |
| Number of detectors per ring | 324 | 784 |
| Crystal dimension (mm) | 7 × 18 × 45 | 2.9 × 5.9 × 30 |
| Type of crystal | $BaF_2$ | BGO |
| Spatial resolution [mm] | 5 | 4 |
| Time resolution (ps) | 650 | 750 |

Figure 7:
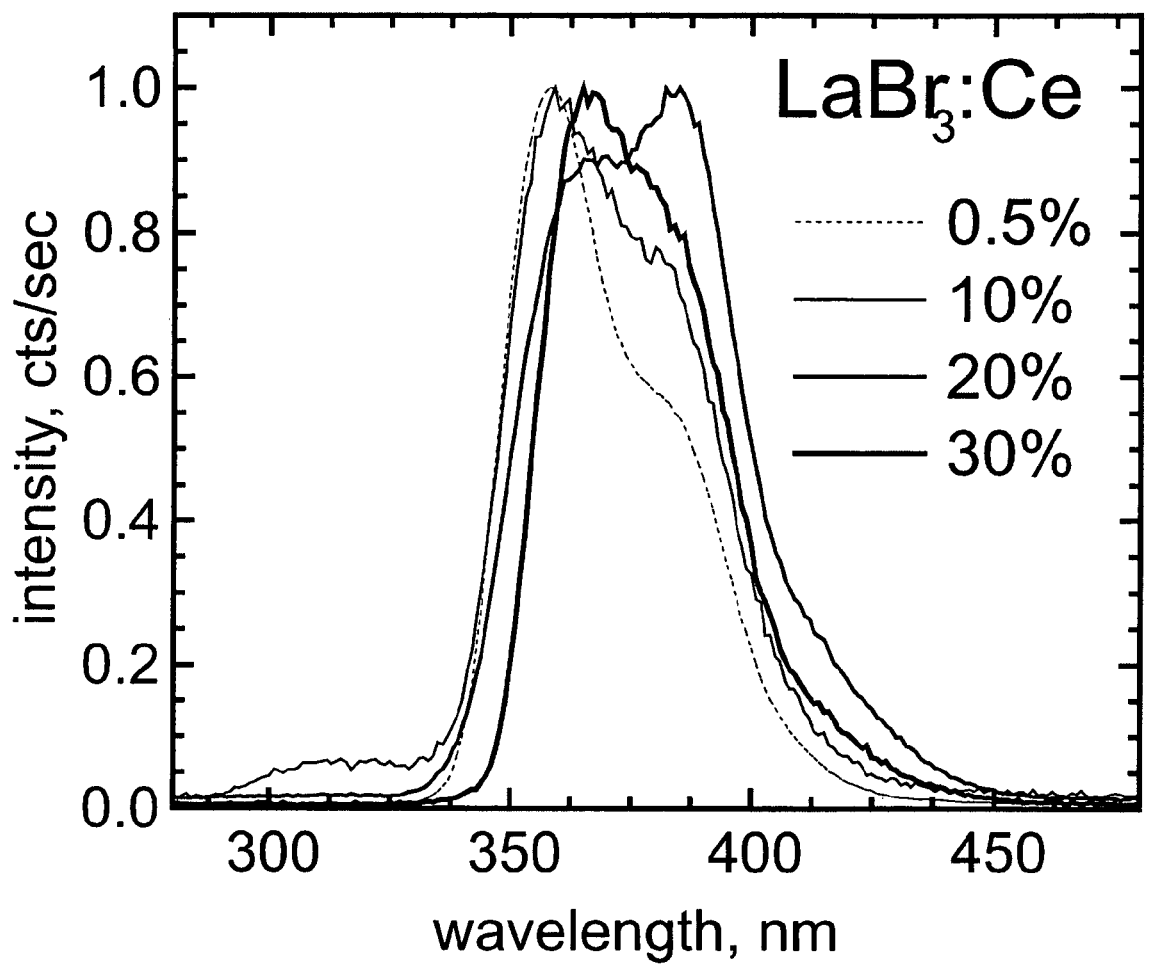
FIG. 7 plots emission spectra measured for $LaBr_3$:Ce crystals with 4 different Ce concentrations of 0.5%, 10%, 20% and 30%.

The present invention includes a method of appropriately doping $LaBr_3$ with trivalent Ce, to obtain a material capable of high light output (greater than 60,000 photons/MeV) well matched to photo-detection (FIG. 7), fast response (FIGS. 5, 5A, 5B) and to time-of-flight positron detection localization capabilities (time resolution of less than 500 ps). $LaBr_3$ doped with $Ce^{3+}$ at concentration of about >1% $Ce^{3+}$ molar weight, and particularly concentrations of about 5%, 10%, 20%, and even 30% and greater have been found to be useful in time-of-flight positron detection localization. Particular attention is drawn to about 10% to about less than 100%, and more particularly between about 10% to about 30% $Ce^{3+}$, and even more particularly about 20% $Ce^{3+}$.

Figure 8:
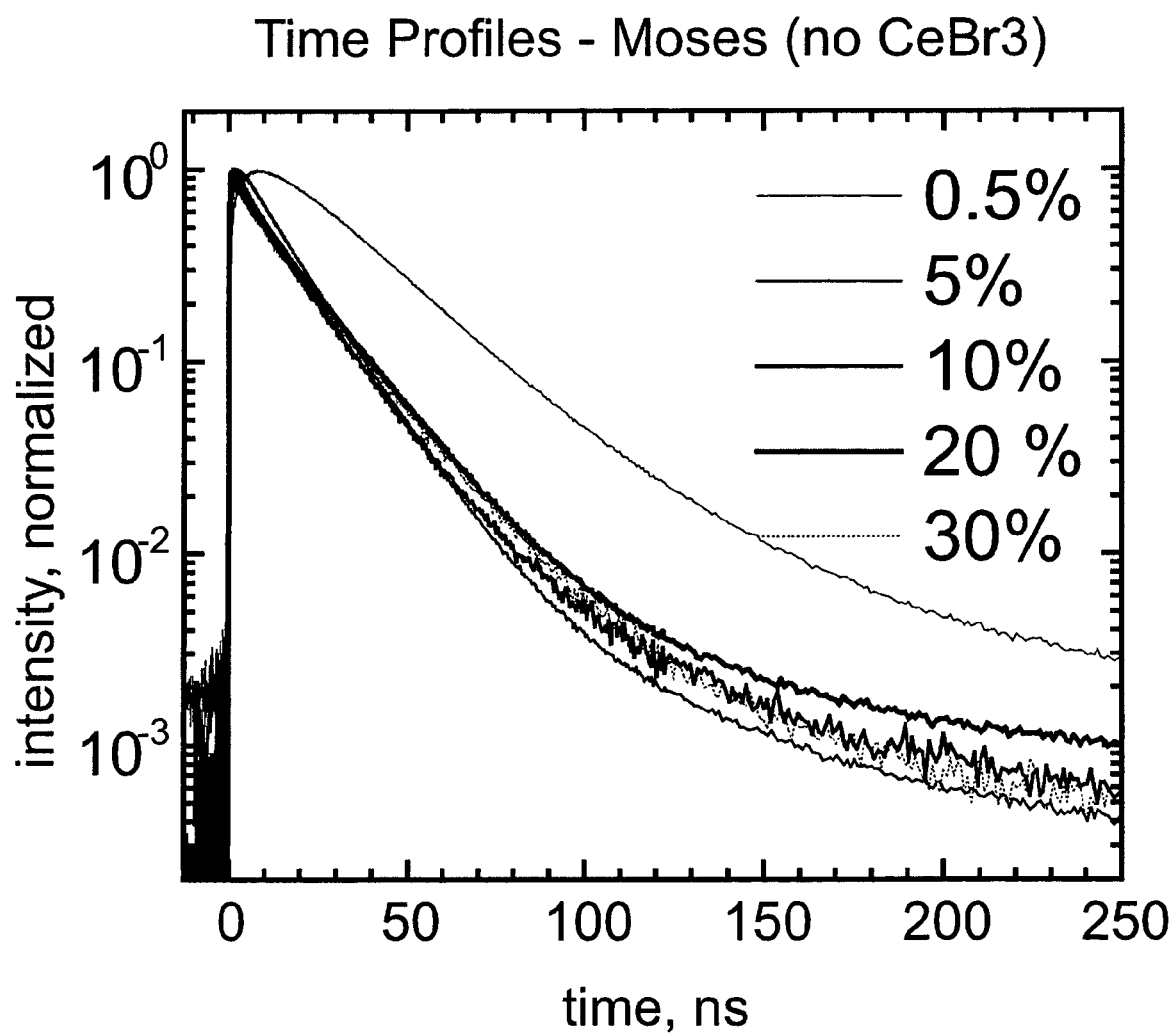
FIG. 8 plots the decay time spectra for $LaBr_3$ crystals with 0.5%, 5%, 10%, 20% and 30% $Ce^{3+}$ concentrations.

Significant timing parameters as a function of doping are listed below in Tables II and III. FIG. 8 illustrates the decay time spectra for $LaBr_3$ crystals with 0.5%, 5%, 10%, 20%, and 30% $Ce^{3+}$ concentrations. The rise and decay time(s) for these timing plots, based on multi-exponential fits to the data are listed in Table II. As seen in the plot, for each increase in $Ce^{3+}$ doping level in the 0.5% to about 10% range, time properties (decay time and/or rise time) improve. At the 20% $Ce^{3+}$ concentration a plateau may have been reached as no significant change in either decay time or rise time was measured.

TABLE II

Scintillation Properties of $LaBr_3$:Ce

| $Ce^{3+}$ Concentration (%) | Light Output (Photons/ MeV) | Decay Time(ns) (% Light Output) | Rise Time (ns) |
| --- | --- | --- | --- |
| 0.2 | 71500 | 23 ns (93.4%), 66 ns (6.6%) | 3.5 ns |
| 0.5 | 71000 | 26 ns (93%), 66 ns (7%) | 5 ns |
| 1.3 | 55400 | 16.5 ns (97%), 66 ns (3%) | 2.9 ns |
| 5 | 70500 | 16 ns (97%), 63 ns (3%) | 0.7 ns |
| 10 | 64500 | 16 ns (94%), 55 ns (6%) | 0.14 ns |
| 20 | 64000 | 17 ns (95%), 70 ns (5%) | 0.14 ns |
| 30 | 69500 | 18.6 ns (97%), 70 ns (3%) | 0.1 ns |

There are some important results that can be appreciated from Table II. As the cerium concentration increases, light output is not significantly reduced. The decay time shortens, which means that the scintillator can handle higher radiation fluxes without saturating. Importantly, the rise time significantly shortens as the Cerium concentration increases.

TABLE III

Properties of Scintillators

| Material | Light Output (Photons/ MeV) | Wavelength of Emission (nm) | Attenuation Length (511 keV) (cm) | Initial Photon Intensity (Photons/(ns × MeV)) | Principal Decay Time (ns) |
| --- | --- | --- | --- | --- | --- |
| NaI(Tl) | 38,000 | 415 | 3.3 | 165 | 230 |
| CsI(Tl) | 52,000 | 540 | 1.9 | 50 | 1000 |
| LSO | 24000 | 420 | 1.2 | 600 | 40 |
| BGO | 8,200 | 505 | 1.1 | 30 | 300 |
| $BaF_2$ | 10,000 ~2,000 fast | 310 slow 220 fast | 2.3 | 3,400 (total) | 620 slow 0.6 fast |
| GSO | 7,600 | 430 | 1.5 | 125 | 60 |
| $CdWO_4$ | 15,000 | 480 | 1.1 | 3 | 5000 |
| YAP | 20,000 | 370 | 2.1 | 570 | 26 |
| $LaBr_3$ (0.5% Ce)[1] | 61,000 | 360 | 2.1 | 1,850 | 31 |
| $LaBr_3$ (0.5% Ce)[2] | 68,000 | 370 | 2.1 | 2,600 | 26 |
| $LaBr_3$ (5% Ce)[2] | 62,500 | 370 | 2.1 | 4,300 | 16 |
| $LaBr_3$ (10% Ce)[2] | 64,500 | 370 | 2.1 | 3,900 | 16 |
| $LaBr_3$ (20% Ce)[2] | 64,000 | 375 | 2.1 | 3,600 | 17 |
| $LaBr_3$ (30% Ce)[2] | 69,500 | 375 | 2.1 | 3650 | 18.6 |

[1]Data based on the Delft University of Technology results (van Leof et al., Nucl. Inst. Meth. Phys. Res. A 486: 254–258 (2002))
[2]Data and results provided herein.

Compared to CsI, which is among the scintillation materials with the highest known light output, $LaBr_3$ produces somewhat more light, has a similar attenuation length, a very fast light output compared to CsI (initial photons, <0.5 ns), and a very fast decay time (<30 ns). As the cerium concentration increases, the initial light output (photon intensity) approximately doubles compared to lower concentrations of cerium.

Figure 4:
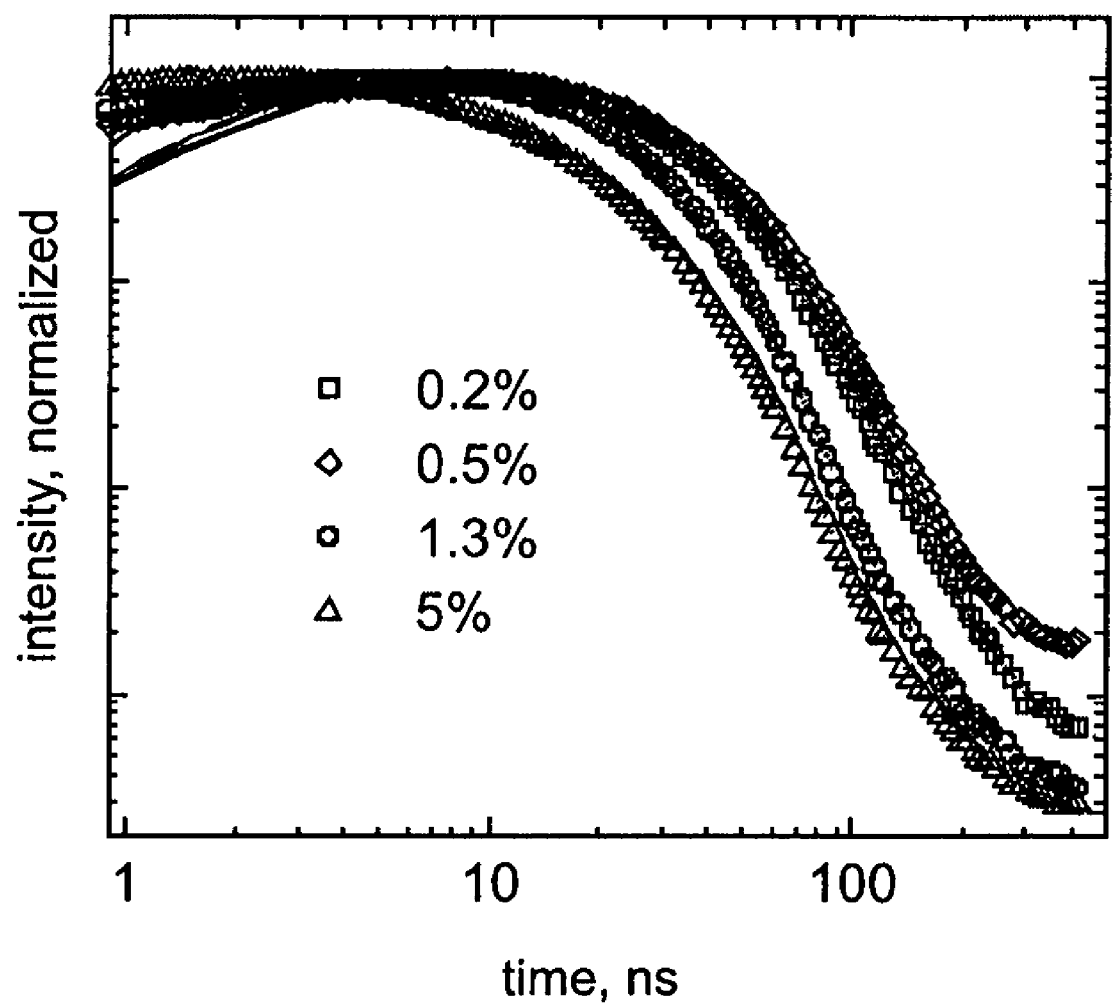
FIG. 4 plots $LaBr_3$ light output vs. time for various concentrations of $Ce^{3+}$.
Figure 5:
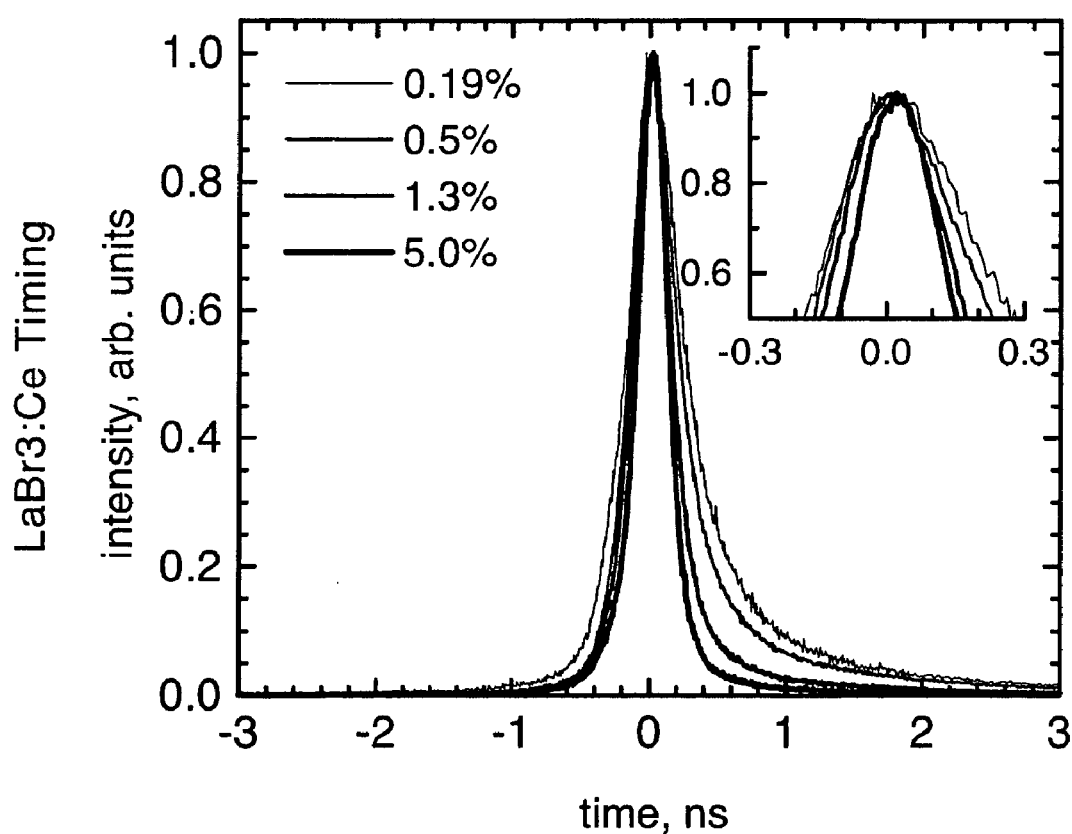
FIG. 5 shows a coincidence timing resolution plots for cerium concentrations of 0.19%, 0.5%, 1.3% and 5.0% $LaBr_3$:Ce.
Figure 5A:
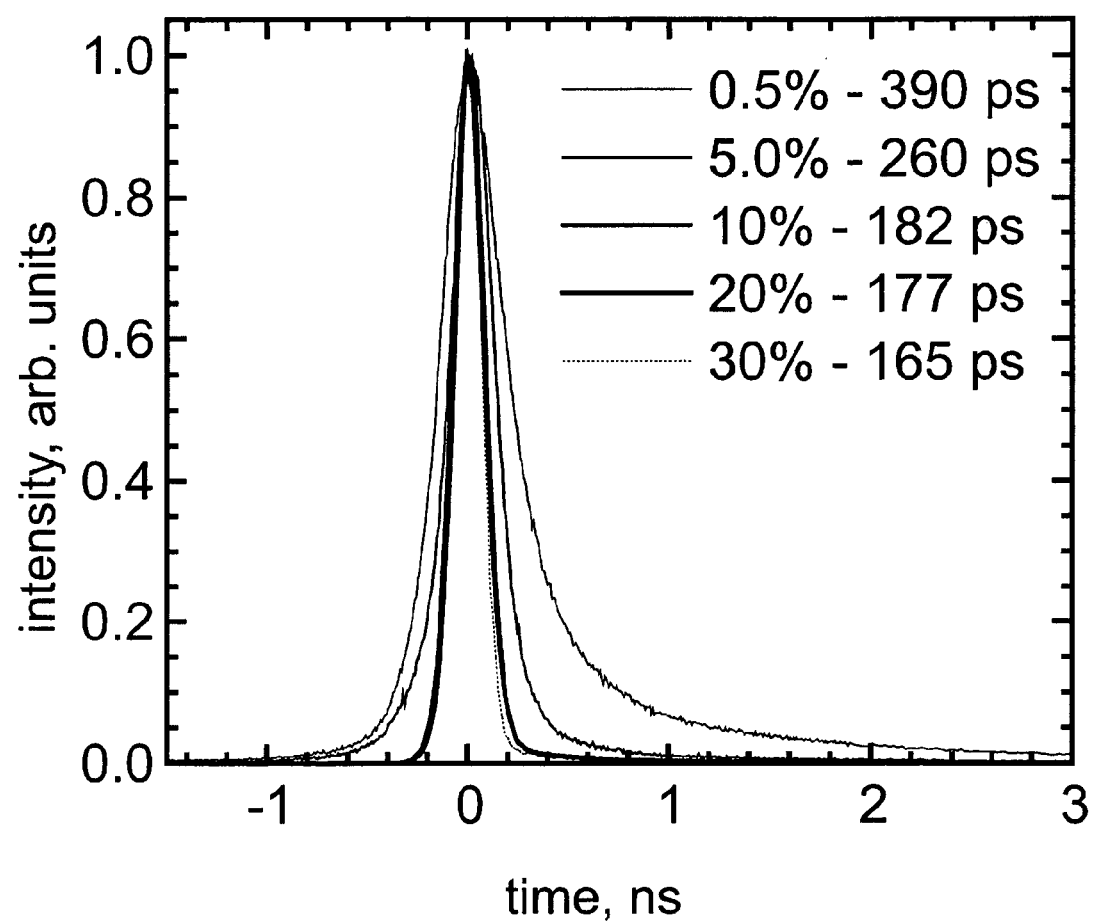
FIG. 5A shows further coincidence timing resolution plots for cerium concentrations of 0.5%, 5.0%, 10%, 20% and 30% $LaBr_3$:Ce.
Figure 9:
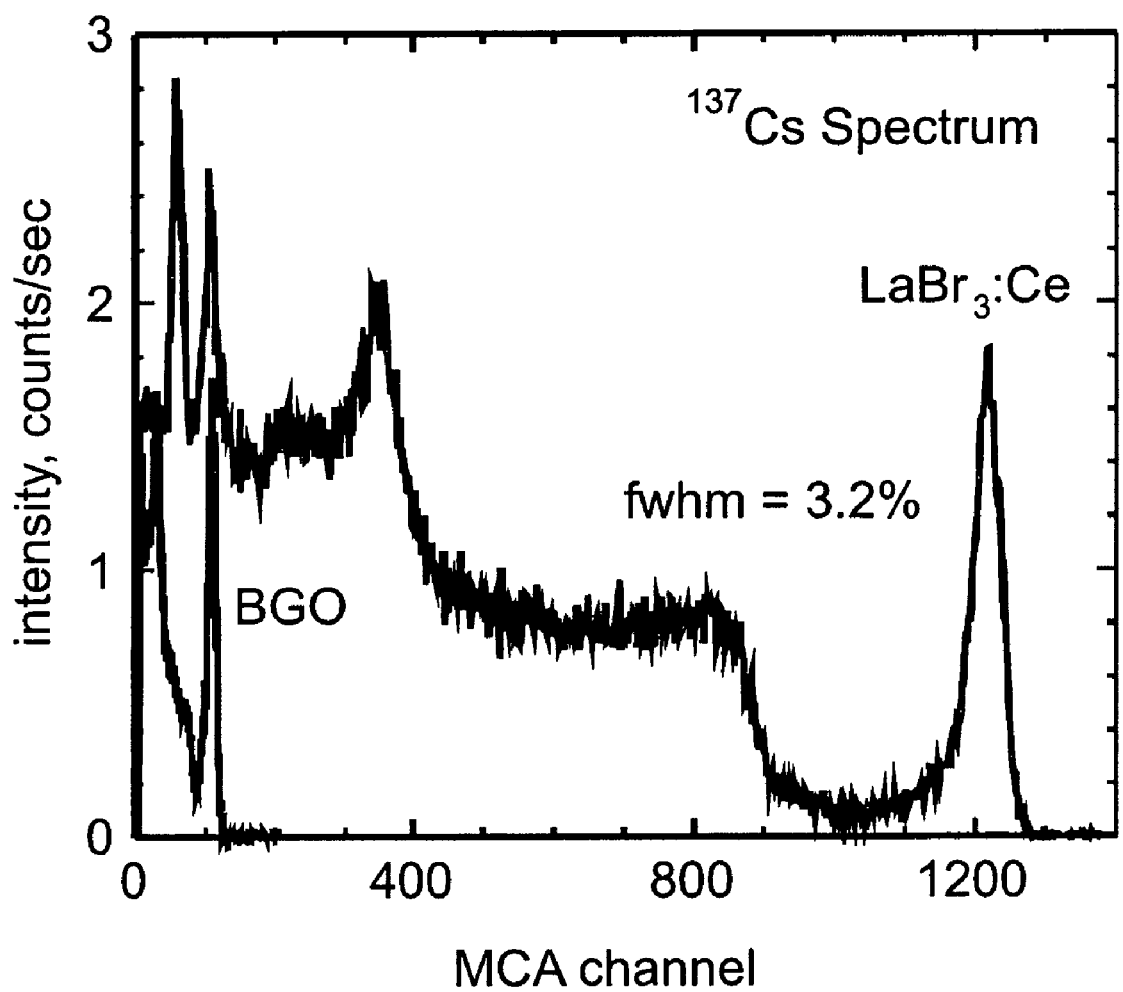
FIG. 9 plots the $^{137}Cs$ spectra recorded with $LaBr_3$:Ce and BGO for comparison.

As can be seen in the FIGS. 5, 5A, and 5B, the particular $Ce^{3+}$ concentration sample of $LaBr_3$ shows a faster rise time as compared to lower $Ce^{3+}$ concentrations (decreasing from 5 ns to 0.1 ns, faster decay (from 26 to 31 ns to about 16 to 18.6 ns), and very high light output (see FIG. 4 and FIG. 9).

The faster rise time for each higher concentration of $Ce^{3+}$ doping translates into better time resolution and spatial localization, as seen in FIGS. 5, 5A, and 5B. FIG. 5B shows the width at 50% from maximum, or full-width at half-maximum (FWHM), with an appreciable narrowing for the LaBr$_3$ compositron with each higher concentration of Ce$^{3+}$ from about 390 ps (0.5% Ce$^{3+}$) to about 165 ps (30% Ce$^{3+}$).

LaBr$_3$ has hexagonal crystal structure and both can be grown directly from the melt by techniques such as Bridgman and Czochralski. This is a useful property because these melt-based techniques are generally easier to scale-up and are used in commercial production of scintillators. LaBr$_3$ is moisture-sensitive and therefore needs to be hermetically packaged to prevent exposure to moisture.

As will be understood by one of skill in the art, fast scintillators are used in conjunction with methods to calibrate each detector to correct for differential time lags that confuse relative timing measurements. In particular embodiments, such corrections are performed by introducing hard-wired delays of appropriate lengths or by software processing based on pre-stored delay times for each detector. Within the practice of the present invention scintillators are used in individual detectors (detector modules) or read by position-sensitive photodetectors or arrays of photodetectors that detect the light from the scintillation of the crystal or ceramic.

Figure 6:
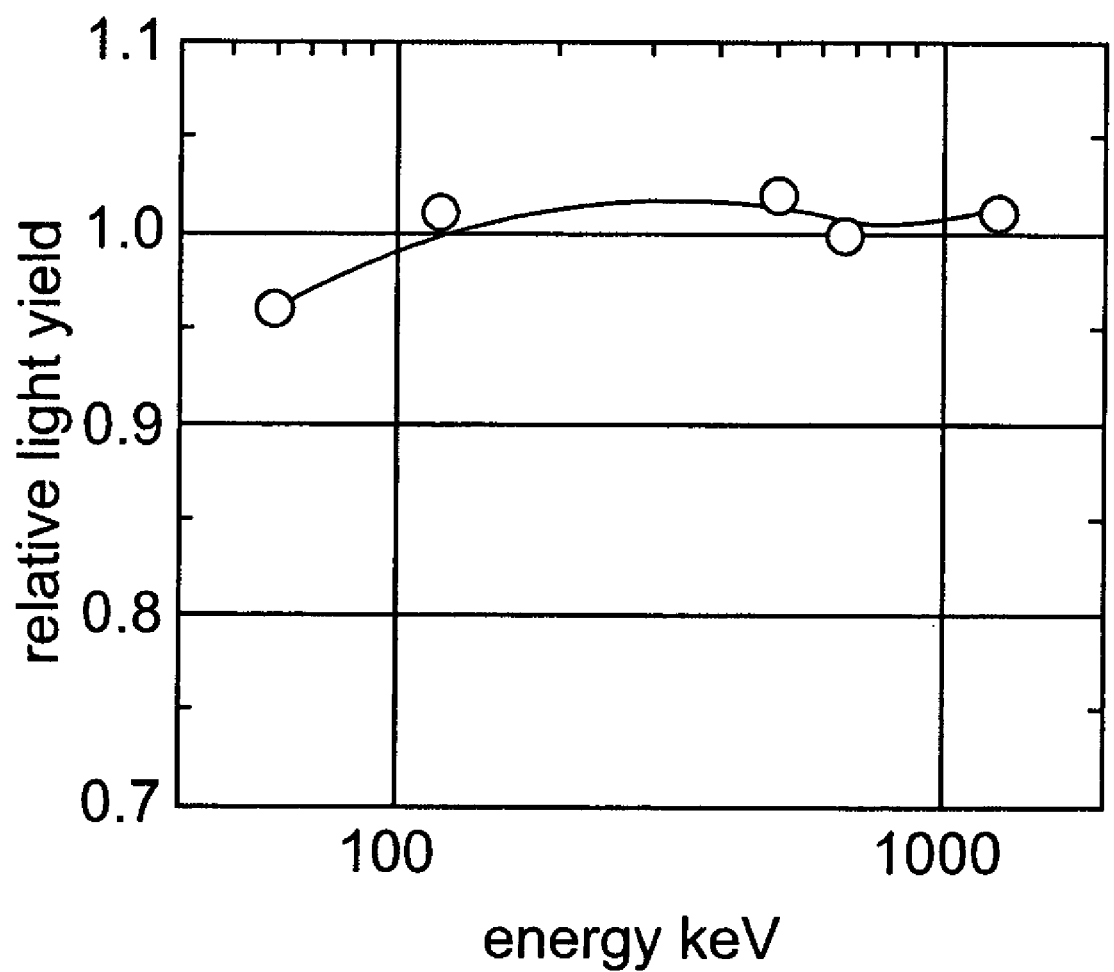
FIG. 6 presents the proportionality of light output to energy input for $LaBr_3$.

The applications of these fast detectors are not limited to PET cameras. They are also useful in applications where fast decay of the light signal is desirable. One such application is x-ray computed tomography (CT), where, as rotation times and individual detector size decrease, detector response time become more important. The high linearity of output of the scintillators of the present invention is of particular use in this application (FIG. 6).

Crystals of LaBr$_3$ scintillator have been grown using the Bridgman process. This material, when doped with cerium (>0.5%), has high light output (~60,000 photons/MeV) and fast principal decay constant ($\leq$25 ns). Energy resolution of 3.2% (FWHM) has been achieved for 662 keV photons ($^{137}$Cs source) at room temperature (FIG. 9). Fast timing resolution (165 ps-FWHM at 30% Ce$^{3+}$) has been recorded with LaBr$_3$-PMT and BaF$_2$-PMT detectors operating in coincidence mode using 511 keV positron annihilation gamma-ray pairs (FIG. 5).

Notable parameters for the scintillation crystals used in spectroscopy of energetic photons (gamma rays) as well as neutrons at room temperature applications include high light output, high stopping efficiency, fast response, low cost, good linearity (FIG. 6), and minimal afterglow.

LaBr$_3$ crystals have hexagonal (UCl$_3$ type) structure with P63/m space group and their density is about 5.3 g/cm$^3$. The compound melts congruently at 783° C. Crystals are usefully grown using melt based methods such as Bridgman and Czochralski though other methods are well known and will be apparent to those of skill in the art.

EXAMPLE 1

LaBr$_3$ Crystals, Bridgman Method

In making crystals, ultra-dry forms of LaBr$_3$ and CeBr$_3$ were used with 99.99% purity. A two zone Bridgman furnace was used with temperature in the hotter zone above the melting point LaBr$_3$ (783° C.) and that of the cooler zone below the melting point. The amount of CeBr$_3$ in the feed material was adjusted to produce LaBr$_3$ samples with varying Ce$^{3+}$ concentration. Most growth runs were performed with 0.5% cerium concentration, although some runs were also performed with other Ce$^{3+}$ concentrations (e.g., 0.2%, 0.5%, 1.3%, 5%, 10%, 20% and 30%). LaBr$_3$ crystals with a size of up to ~2.3 cm$^3$ were grown. These crystals were cut from the solid ingots and polished using non-aqueous slurries (due to hygroscopic nature of LaBr$_3$) prepared by mixing mineral oil with Al$_2$O$_3$ grit. The crystals were then packaged to prevent long exposure to moisture. This involved encapsulating the crystal in an epoxy (e.g., Epoxy STYCAST #1266 Value23LV Titanium Oxide and EPO-TEK 301 between the crystal and window) with a thin quartz window (0.5 mm) placed on the crystal face, which would be coupled to an optical sensor, such as but not limited to, a hermetic package with an aluminum housing.

EXAMPLE 2

LaBr$_3$:Ce, Scintillation Properties

Characterization of the scintillation properties of LaBr$_3$ crystals grown by the Bridgman process involved measurement of the light output, the emission spectrum, and the fluorescent decay time of the crystals. Variation of these scintillation properties with Ce$^{3+}$ concentration was analyzed. Energy and timing resolution of LaBr$_3$:Ce crystals were also measured.

Light Output and Energy Resolution

The light output of LaBr$_3$:Ce crystals was measured by comparing their response and the response of a calibrated BGO scintillator to the same isotope (662 keV γ-rays, $^{137}$Cs source, see FIG. 9). These measurements involved optical coupling of a LaBr$_3$:Ce sample to a photomultiplier tube (with multi-alkali S-20 photocathode), irradiating the scintillator with 662 keV photons and recording the resulting pulse height spectrum. In order to maximize light collection, LaBr$_3$:Ce crystals were wrapped in reflective, white Teflon tape on all faces (except the one coupled to a photomultiplier (PMT)). An index matching silicone fluid was also used at the PMT-scintillator interface. A pulse height spectrum was recorded with a LaBr$_3$:Ce crystal (~1 cm$^3$ size, 0.5% Ce). This experiment was then repeated with a calibrated BGO scintillator (which had light output of 8000 photons/MeV). FIG. 9 shows pulse height spectra for both LaBr$_3$:Ce and BGO under $^{137}$CS irradiation and amplifier shaping time of 4.0 μsec. This shaping time was long enough to allow full light collection from both the scintillators. The photomultiplier (PMT) bias and amplifier gain were the same for both spectra. Based on the recorded photopeak positrons for LaBr$_3$:Ce and BGO, and by taking into account the photocathode quantum efficiency for BGO and LaBr$_3$:Ce, the light output of LaBr$_3$:Ce crystal with 0.5% Ce was estimated to be about 60,000 photons/MeV.

Also studied was the variation in light output of LaBr$_3$:Ce crystals as a function of the cerium concentration in these crystals. Crystals with cerium concentration of 0.2%, 0.5%, 1.3%, 5%, 10%, 20% and 30% were investigated. Each crystal was coupled to a PMT and 662 keV γ-ray spectra ($^{137}$Cs source) were recorded with these crystals under identical operating conditions. Data were collected at a shaping time of 4 μs and the results reported in Table III, indicate that all Ce$^{3+}$ concentrations provided high light output with the highest values observed at the lower Ce$^{3+}$ concentrations. Although, the crystals with 30% Cerium doping demonstrated an increase in light output (69500 photons/MeV) above that measured for 10% and 20% Cerium doped crystals (64000 and 64500 photons/MeV, respectively), the measured light output was still less than that measured for 0.5% and 5% Cerium doped crystals (71000 and 70500 photons/MeV, respectively). The light output of the sample with 1.3% Ce$^{3+}$ concentration was lower than expected, which was probably due to poorer quality of that crystal as compared to other samples. All of the LaBr$_3$Ce crystals provided more light output than fast scintillator crystals currently in use for PET systems.

The energy resolution of the 662 keV photopeak recorded with a LaBr$_3$:Ce scintillator (0.5% Ce) has been measured to be 3.2% full-width at half-maximum (FWHM) at room temperature as shown in FIG. 9. The energy resolution obtained with LaBr$_3$:Ce crystals approached the energy resolution of room temperature semiconductor detectors such as CdTe and CdZnTe of similar size. A LaBr$_3$:Ce crystal (coupled to a PMT) has been characterized using other gamma ray energies such as 511 keV ($^{22}$Na source) and 122 keV ($^{57}$Co source). The energy resolution is 3.6% (FWHM) and 6.8% (FWHM), respectively, at room temperature.

Emission Spectrum

The emission spectrum of the LaBr$_3$:Ce scintillators was measured. The LaBr$_3$:Ce samples were excited with radiation from a Philips X-ray tube having a copper target. The scintillation light was passed through a McPherson monochromator and detected by a Hamamatsu R2059 photomultiplier tube with a quartz window.

FIG. 7A shows the normalized emission spectra for LaBr$_3$:Ce samples with 0.2, 0.5, 1.3, and 5% Ce concentrations and FIG. 7B shows the normalized emission spectra for LaBr$_3$:Ce samples with 0.5%, 10%, 20% and 30% Ce concentrations. As seen in FIGS. 7A and 7B, emission peaks at 360 and 380 nm, which are characteristic for Ce$^{3+}$ luminescence, were present for all cerium concentrations. There appears to be no significant emission from these samples due to other mechanisms such as luminescence from self-trapped excitons or binary electron-hole recombination, which could cause slower component(s).

Decay Time

The fluorescent decay times of LaBr$_3$:Ce samples (doped with 0.2, 0.5, 1.3, 5, 10, 20, and 30% Ce) were measured using the delayed coincidence method as described in Bollinger and Thomas (Rev. Sci. Instr.,32:1044 (1961), the teachings of which are incorporated herein by reference). The x-ray source was a light-excited x-ray tube that produced 4,000 x-ray photons (of mean energy 18.5 keV) per steradian in each 1 ps FWHM pulse, with a 50 kHz repetition rate. The LaBr$_3$:Ce samples were placed in the x-ray beam and their fluorescent emanations were detected with a sapphire-windowed microchannel plate photomultiplier tube (spectral range 150–650 nm, transit time jitter 40 ps FWHM). The time difference between the x-ray pulse and the detected fluorescent emissions was measured using a TAC/ADC combination having 2 ps FWHM resolution. The total system response time was 60 ps FWHM. The decay time spectrum for each LaBr$_3$:Ce sample was measured up to 430 ns after x-ray exposure in this manner and was fitted to the sum of exponentials and a time-independent background. The fit results are shown in FIG. 4 and Table II. As seen in the table, all samples independent of Ce$^{3+}$ concentration show very fast principal decay constant ($\leq$~25 ns). These results are consistent with the emission spectra shown in FIG. 7 where Ce$^{3+}$ luminescence appears to be the primary scintillation component. Some evidence of rise time (in 1–4 ns range) was also observed in these studies. The light output (normalized to 0.5% Ce$^{3+}$, optical emission spectrum, and decay time data for all four Ce$^{3+}$ concentrations in LaBr$_3$ are summarized in Table II.

Coincidence Timing Resolution

Coincidence timing resolution of LaBr$_3$:Ce crystals with various Ce$^{3+}$ concentrations was measured. This involved irradiating a BaF$_2$ and LaBr$_3$:Ce scintillators, each coupled to a fast PMT (Hamamatsu R-5320, operated at −2000V) with 511 keV positron annihilation γ-ray pairs (emitted by a $^{68}$Ga source). The BaF$_2$-PMT detector formed a "start" channel in the timing circuit, while the LaBr$_3$-PMT detector formed the "stop" channel. The signal from each detector was processed using two channels of a Tennelec TC-454 CFD that had been modified for use with fast (sub-ns) rise-time PMTs. The time difference between the start and stop signals was digitized with a Tennelec TC-862 TAC and a 16-bit ADC, resulting in a TDC with 7.5 ps per bin resolution. Data were accumulated until the coincidence timing distribution had approximately 10,000 counts in the maximum bin. FIG. 5 and 5A show a coincidence timing resolution plot acquired in this manner with LaBr$_3$:Ce crystal having 5% Ce$^{3+}$ concentration and the timing resolution was measured to be 260 ps (FWHM). Similar measurements were also made with LaBr$_3$:Ce crystals having 0.2%, 0.5%, and 1.3% Ce$^{3+}$ concentrations placed in the "stop" channel, and the coincidence timing resolution was measured to be 450 ps, 390 ps, and 320 ps (FWHM), respectively (FIG. 5). Still further measurements were made with LaBr$_3$:Ce crystals having 0.5%, 5%, 10%, 20% and 30% Ce$^{3+}$ concentrations placed in the "stop" channel, and the coincidence timing resolution was measured to be 390 ps, 260 ps, 182 ps, 177 ps and 165 ps (FWHM), respectively (FIG. 5A). The timing resolution for two BaF$_2$ detectors in coincidence with each other was measured to be 240 ps (FWHM) in this study.

Proportionality of Response

Proportionality of response (or linearity) of LaBr$_3$:Ce scintillators was evaluated. Non-proportionality (as a function of energy) in light yield can be one of the important reasons for degradation in energy resolution of established scintillators such as NaI(Tl) and CsI(Tl) (Dorenbos et al., IEEE Trans. Nucl. Sci. 42:2190–2202 (1995)). Light output of LaBr$_3$:Ce under excitation from isotopes such as $^{241}$Am (60 keV γ-rays), $^{57}$Co (122 keV γ-rays), $^{22}$Na (511 keV and 1275 keV γ-rays) and $^{137}$CS (662 keV γ-rays) was measured. A LaBr$_3$:Ce crystal (0.5% Ce) was wrapped in Teflon tape and coupled to a PMT. Pulse height measurements were performed using standard NIM equipment with the scintillator exposed to different isotopes. The same settings were used for PMT and pulse processing electronics for each isotope. From the measured peak positron and the known γ-ray energy for each isotope, the light output (in photons/MeV) at each γ-ray energy was estimated. The data points were then normalized with respect to the light output value at 662 keV energy and the results (shown in FIG. 6) indicate that LaBr$_3$:Ce is a very proportional scintillator. Over the energy range from 60 to 1275 keV, the non-proportionality in light yield was about 6% for LaBr$_3$:Ce, which is substantially better than that for many established scintillators. For example, over the same energy range, the non-proportionality is about 35% for LSO and about 20% for NaI(Tl) and CsI(Tl) has been reported (Gillot-Noel et al., IEEE Trans. Nucl. Sci. 46:1274–1284 (1999)).

Basic PET Configuration

Figure 10:
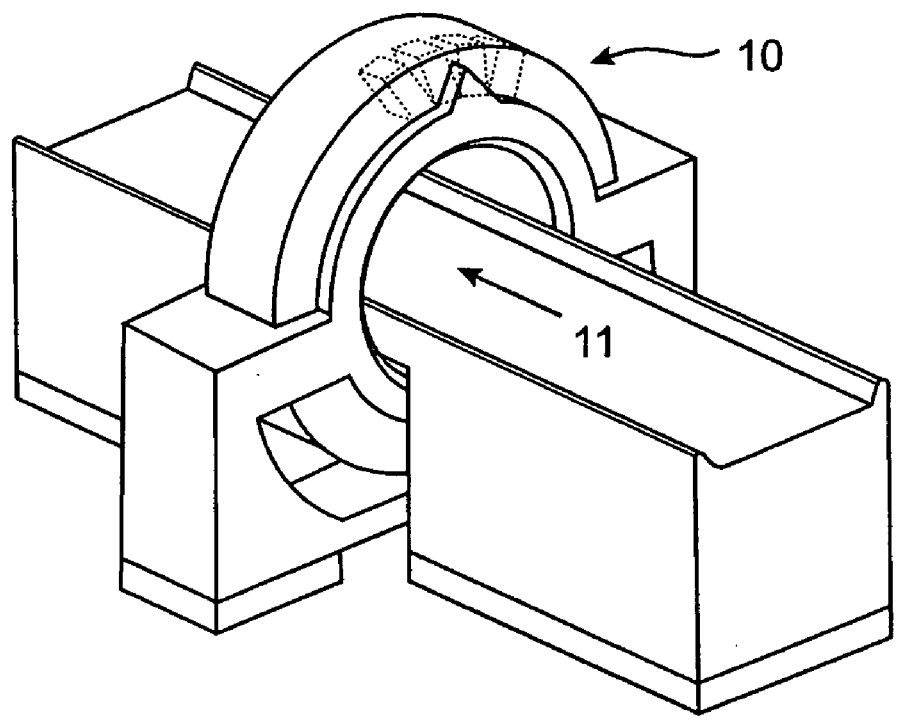
FIG. 10. shows a schematic of a positron emission camera system encompassed by the present invention.

A PET camera system typically comprises of a polygonal or circular ring of radiation detectors (10) placed around a patient area (11), as shown in FIG. 10. In some embodiments radiation detection begins by injecting isotopes with short half-lives into a patient's body placeable within the patient area (11). As noted above, the isotopes are taken up by target areas within the body, the isotope emitting positrons that are detected when they generate paired coincident gamma-rays. The annihilation gamma-rays move in opposite directions, leave the body and strike the ring of radiation detectors (10).

Figure 11:
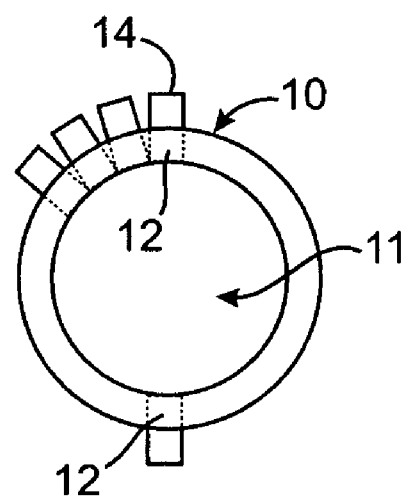
FIG. 11 shows a schematic of the detector arrangement for a positron emission camera system encompassed by the present invention.

As shown in FIG. 11, the ring of detectors (10) includes an inner ring of scintillators (12) and an attached ring of light detectors or photomultiplier tubes (14). The scintillators (12) respond to the incidence of gamma rays by emitting a flash of light (scintillation) that is then converted into electronic signals by a corresponding adjacent photomultiplier tube or light detectors (14). A computer control system (not shown) records the location of each flash and then plots the source of radiation within the patient's body. The data arising from this process is usefully translated into a PET scan image such as on a PET camera monitor by means known to those in the art.

Figure 12:
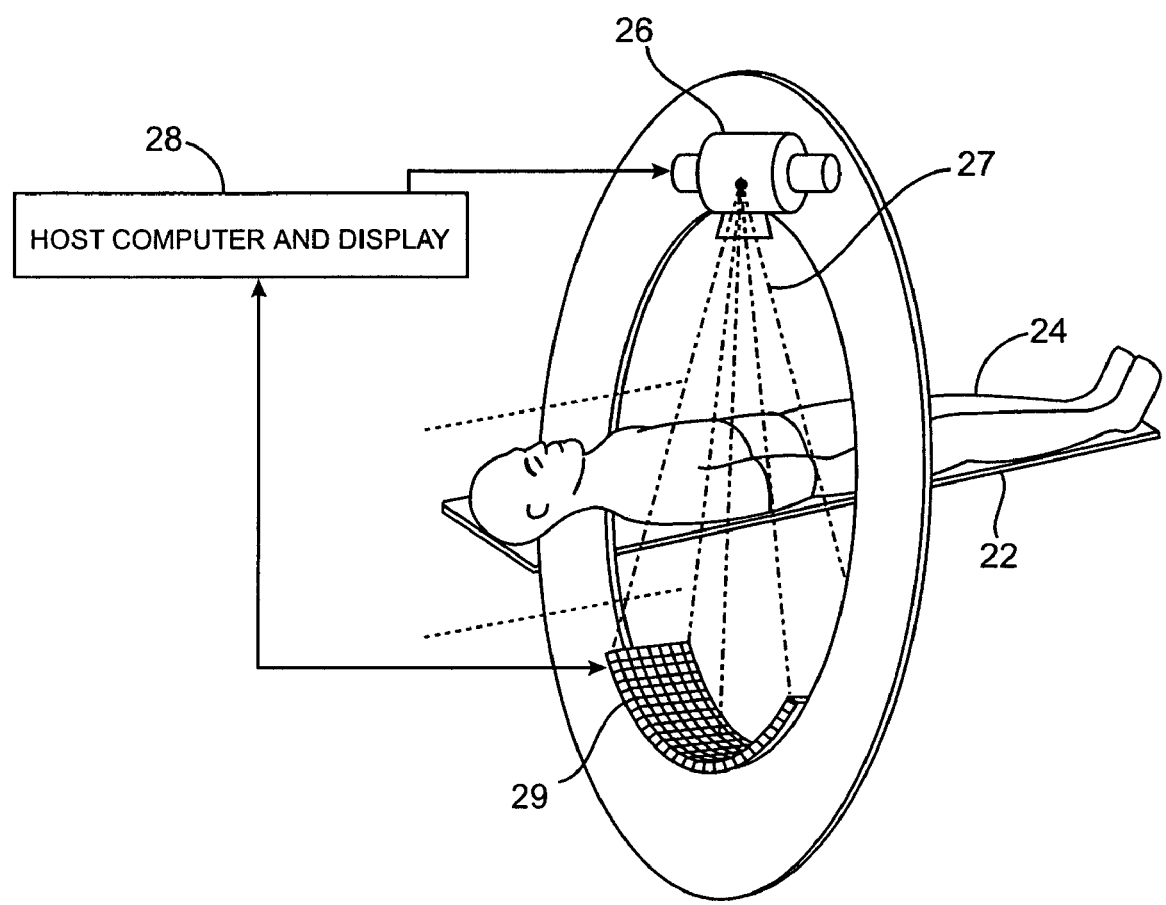
FIG. 12 shows a schematic of an x-ray computed tomography scanner system encompassed by the present invention.

This invention has been discussed in terms of crystal scintillators for use in PET, and particularly useful in time-of-flight PET. Such application of the technology is illustrative only. Many, indeed most, ionizing radiation applications will benefit from the inventions disclosed herein. Specific mention is made to X-ray CT, X-ray fluoroscopy, X-ray cameras (such as for security uses), and the like. For example, as shown in FIG. 12, a CT scanner 20, as well known to the skilled artisan, typically comprises a patient bed 22 for receiving a patient 24, a penetrating X-ray source 26(i.e., an X-ray tube) for delivering energy 27 to the patient 24, a detector assembly and associated processing electronics 29, and a host computer and software for image reconstruction, display, manipulation, post-acquisition calculations, storage and retrieval 28.

What is claimed is:

1. A positron emission tomography scanner system comprising:
   a patient area;
   an assembly of radiation detectors disposed adjacent the patient area, wherein the radiation detectors comprise:
      a scintillator comprising lanthanum bromide and a trivalent cerium dopant and comprising a timing resolution of less than 500 picoseconds;
      a scintillation light detector or photomultiplier tube optically coupled to the scintillator; and
      a control system coupled to the light detectors or photomultiplier tubes and configured to perform a time-of-flight localization of a positron annihilation event based on detecting;
      signals generated by the scintillators.

2. The positron emission tomography scanner system of claim 1, wherein said dopant is present at about 0.5% or more and less than about 100% by molar weight.

3. The positron emission tomography scanner system of claim 1, wherein said dopant is present at about 10% or more and less than about 30% by molar weight.

4. The positron emission tomography scanner system of claim 1, wherein said dopant is present at 20% by molar weight.

5. The positron emission tomography scanner system of claim 1, wherein the scintillator comprises a timing resolution less than about 400 picoseconds.

6. The positron emission tomography scanner system of claim 1, wherein the scintillator comprises a rise time below about 3.4 nanoseconds.

7. The positron emission tomography scanner system of claim 1, wherein the scintillator comprises a rise time below 0.14 nanoseconds.

8. The positron emission tomography scanner system of claim 1, having a fast component with a decay constant of about 15 to about 18 nanoseconds and a slow component, if present, with a decay constant of about 55 to about 70 nanoseconds.

9. The positron emission tomography scanner system of claim 1, wherein said scintillator is used in coincidence detection positron emission tomography by recording the differential arrival time of two photons so as to localize the annihilation event.

10. The positron emission tomography scanner system of claim 9, wherein the localization is to within a full width at half maximum (FWHM) smaller than 15 cm from the annihilation point.

11. The positron emission tomography scanner system of claim 1, wherein the radiation detector comprises two or more radiation detectors,
   wherein each scintillation light detector comprises a position sensitive detector or array.

12. The positron emission tomography scanner system of claim 1, further comprising a means to correct for different timing offsets of each individual radiation detector.

13. The positron emission tomography scanner system of claim 12, wherein timing offsets of individual radiation detectors are stored in a memory in the control system.

14. The positron emission tomography camera scanner system of claim 13, wherein for each radiation detector the timing offsets are subtracted from each gamma-ray time arrival value prior to computation of a localization.

15. The positron emission tomography camera scanner system of claim 1, wherein timing signals of individual radiation detectors are equalized by an introduction of individual hardwired delays in signal readout electronics in the control system.

16. A method of performing time-of-flight positron emission tomography comprising:
   positioning a patient in a patient area, wherein the patient has been administered with a radiopharmaceutical label;
   positioning a plurality of scintillators and detectors around the patient area, wherein at least some of the scintillators comprise lanthanum bromide (LaBr3) and trivalent cerium as a dopant and comprise a timing resolution of less than 500 picoseconds;
   detecting gamma ray emissions from the patient with the plurality of scintillators and detectors; and
   performing a time-of-flight localization of a positron annihilation event using the gamma ray emissions detection.

17. The method of claim 16, wherein said scintillator has a timing resolution of less than 400 picoseconds.

18. The method of claim 16, wherein said scintillator has a rise time of less than about 3.4 nanoseconds.

19. The method of claim 16, wherein said scintillator has a rise time of less than about 0.14 nanoseconds.

20. The method of claim 16, wherein said scintillator has a fast component with a decay constant of about 15 to about 18 nanoseconds and a slow component, if present, with a decay constant of about 55 to about 70 nanoseconds.

21. The method of claim 16, wherein said Cerium dopant is present at about 0.5% or more and less than about 100% by molar weight.

22. The method of claim 16, wherein said Cerium dopant is present at about 10% or more and less than about 100% by molar weight.

23. The method of claim 16, wherein said Cerium dopant is present at about 10% or more and less than about 30% by molar weight.

24. The method of claim 16, wherein said Cerium dopant is present at 20% by molar weight.

25. The method of claim 16, wherein said performing a time-of-flight localization of a positron annihilation event comprises recording the differential arrival time of two photons so as to localize the annihilation event.

26. The method of claim 25, wherein the localization is to within a FWHM smaller than 15 cm from the annihilation point.

* * * * *